United States Patent
Kushnir et al.

(10) Patent No.: US 10,418,942 B2
(45) Date of Patent: Sep. 17, 2019

(54) REFERENCE SIGNAL PATH FOR CLOCK GENERATION WITH AN INJECTION LOCKED MULTIPLIER (ILM)

(71) Applicant: Intel IP Corporation, Santa Clara, CA (US)

(72) Inventors: Igal Yehuda Kushnir, Hod-Hasharon (IL); Gil Horovitz, Emek Hefer (IL); Ronen Kronfeld, Shoham (IL); Sarit Zur, Petah-Tikva (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/171,373

(22) Filed: Jun. 2, 2016

(65) Prior Publication Data
US 2017/0353159 A1    Dec. 7, 2017

(51) Int. Cl.
*H03B 19/00* (2006.01)
*H03B 19/14* (2006.01)
*H04L 7/02* (2006.01)
*H03L 7/24* (2006.01)

(52) U.S. Cl.
CPC ............ *H03B 19/14* (2013.01); *H03L 7/24* (2013.01); *H04L 7/02* (2013.01); *H03B 2200/0074* (2013.01)

(58) Field of Classification Search
CPC ........ H03B 19/10; H03B 19/00; H03B 19/14; H03B 19/16; H03K 5/00006
USPC ........................................................ 327/119
See application file for complete search history.

(56) References Cited

U.S. PATENT DOCUMENTS

| | | | | |
|---|---|---|---|---|
| 6,031,429 A | * | 2/2000 | Shen | ......................... H03L 3/00 327/156 |
| 9,083,588 B1 | | 7/2015 | Xu et al. | |
| 2002/0075045 A1 | * | 6/2002 | Kawauchi | .............. H03B 19/00 327/119 |

(Continued)

FOREIGN PATENT DOCUMENTS

| | | | |
|---|---|---|---|
| CN | 102474260 A | | 5/2012 |
| CN | 103475310 A | * | 12/2013 |

(Continued)

OTHER PUBLICATIONS

"European Application Serial No. 17168902.9, Extended European Search Report dated Oct. 12, 2017", 14 pgs.

(Continued)

*Primary Examiner* — Anh Q Tra
(74) *Attorney, Agent, or Firm* — Schiff Hardin LLP

(57) ABSTRACT

Embodiments of a reference path circuit and communication device are generally described herein. The reference path circuit may include an injection locked multiplier (ILM) and a group of one or more buffer amplifiers. The ILM may receive a sinusoidal reference signal from a reference oscillator at a reference frequency. The ILM may generate a sinusoidal ILM output signal at an ILM output frequency that is based on an integer multiple of the reference frequency. The integer multiple of the reference frequency may be within a locking range of the ILM that may be based on a resonant frequency of the ILM. The group of one or more buffer amplifiers may generate an output clock signal for input to the frequency synthesizer. The output clock signal may be based on a sign function of the ILM output signal.

21 Claims, 6 Drawing Sheets

(56) References Cited

U.S. PATENT DOCUMENTS

| | | | |
|---|---|---|---|
| 2010/0020730 A1 | 1/2010 | Man et al. | |
| 2014/0084971 A1* | 3/2014 | Kuo | H03B 19/00 327/119 |
| 2015/0326205 A1* | 11/2015 | Cho | H03H 11/245 333/81 R |

FOREIGN PATENT DOCUMENTS

| | | | |
|---|---|---|---|
| WO | 2008144152 | 11/2008 | |
| WO | WO 2015042814 A1 * | 4/2015 | H03B 5/1228 |

OTHER PUBLICATIONS

Chang-Chun, Chen, "Dual-injection sub-harmonic injection-locked frequency tripler", Microwave Conference Proceedings (APMC), 2012 Asia-Pacific, IEEE, (Dec. 4, 2012), 1214-1216.

Chirn, Chye Boon, "Low-power LC-tank-reused injection-locked frequency multiplier", Circuits and Systems (MWSCAS), 2011 IEEE 54th International Midwest Symposium on, IEEE,, (Aug. 7, 2011), 1-4.

Lin, Zhang, "Injection-Locked Clocking: A New GHz Clock Distribution Scheme", Conference 2006, IEEE Custom Integrated Circuits,, (Sep. 1, 2006), 785-788.

Wei, Wang, "A K-band injection-locked frequency tripler with injection-enhancement in 130-nni CM0S", 2014 12th IEEE International Conference on Solid-State and Integrated Circuit Technology (ICSICT), IEEE., (Oct. 28, 2014), 1-3.

Office Action dated Mar. 5, 2019 for Chinese Patent Application No. 201710303787.2.

Communication pursuant to Article 94—European application No. 17 168 902.9, dated Oct. 5, 2018.

Belal M. Helal et al., "A Low Jitter Programmable Clock Multiplier Based on a Pulse Injection-Locked Oscillator With a Highly-Digital Tuning Loop", IEEE Journal of Solid-State Circuits, vol. 44, No. 5, May 2009.

* cited by examiner

REFERENCE SIGNAL PATH FOR CLOCK GENERATION WITH AN INJECTION LOCKED MULTIPLIER (ILM)

TECHNICAL FIELD

Some embodiments pertain to reference path circuits. Some embodiments relate to generation of clock signals for input to devices, including frequency synthesizers. Some embodiments relate to injection locked multipliers (ILM). Some embodiments relate to communication devices for wireless and/or wired communication. Some embodiments relate to electrical devices and/or components that include ILMs.

BACKGROUND

Electrical devices may utilize various signals for operation, such as sinusoidal signals, clock signals or other signals. As an example, a clock signal may be input to a frequency synthesizer, which may generate output signals at a variety of frequencies. In some cases, a quality of the output signals of the frequency synthesizer may be related to a quality of the input clock signal. Accordingly, there is a need for devices and components to generate clock signals and other signals in these and other scenarios.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
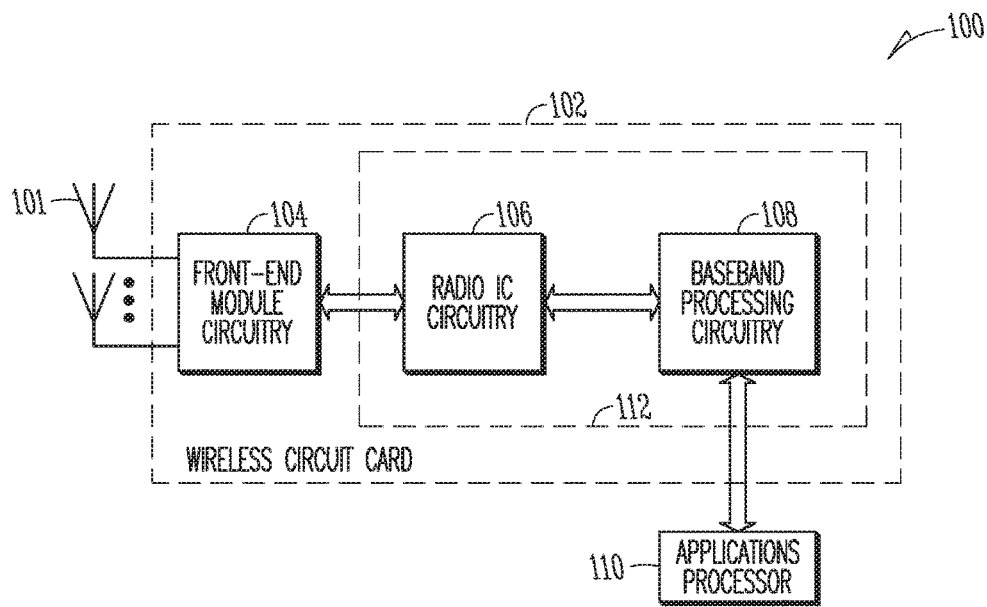
FIG. 1 is a block diagram of a radio architecture in accordance with some embodiments.

FIG. 1 is a block diagram of a radio architecture 100 in accordance with some embodiments. In some embodiments, some or all of the techniques or operations described herein may be applicable to the radio architecture 100 or other radio architectures. Some or all of the techniques described herein may be applicable to communication devices or other devices that may include a radio architecture such as 100 or other. However, the scope of embodiments is not limited in this respect, as some or all of the techniques or operations described herein may be applicable to other devices or architectures, in some embodiments. In some embodiments, some or all of the techniques or operations described herein may be applicable to devices or architectures that may not necessarily be related to a radio architecture or communication device.

Referring to FIG. 1, the radio architecture 100 may include front-end module circuitry 104, radio IC circuitry 106 and baseband processing circuitry 108. Front-end module circuitry 104 may include a receive signal path which may include circuitry configured to operate on RF signals received from one or more antennas 101, amplify the received signals and provide the amplified versions of the received signals to the radio IC circuitry 106 for further processing. Front-end module circuitry 104 may also include a transmit signal path which may include circuitry configured to amplify signals for transmission provided by the radio IC circuitry 106 for transmission by one or more of the antennas 101.

Radio IC circuitry 106 may include a receive signal path which may include circuitry to down-convert RF signals received from the front-end module circuitry 104 and provide baseband signals to the baseband processing circuitry 108. Radio IC circuitry 106 may also include a transmit signal path which may include circuitry to up-convert baseband signals provided by the baseband processing circuitry 108 and provide RF output signals to the front-end module circuitry 104 for subsequent transmission.

Baseband processing circuitry 108 may include one or more processors and control logic to process the baseband signals received from the receive signal path of the radio IC circuitry 106 and to generate the baseband signals for the transmit signal path of the radio IC circuitry 106. Baseband processing circuitry 108 may interface with applications processor 110 for generation and processing of the baseband signals and for controlling operations of the radio IC circuitry 106.

In some embodiments, the antennas 101, the front-end module circuitry 104, the radio IC circuitry 106, and baseband processing circuitry 108 may be provided on a single circuit card, such as wireless circuit card 102, although the scope of the embodiments is not limited in this respect. In some other embodiments, the antennas 101, the front-end module circuitry 104 and the radio IC circuitry 106 may be provided on a single circuit card. In some embodiments, the radio IC circuitry 106 and the baseband processing circuitry 108 may be provided on a single chip or integrated circuit (IC), such as IC 112, although the scope of the embodiments is not limited in this respect.

Figure 2:
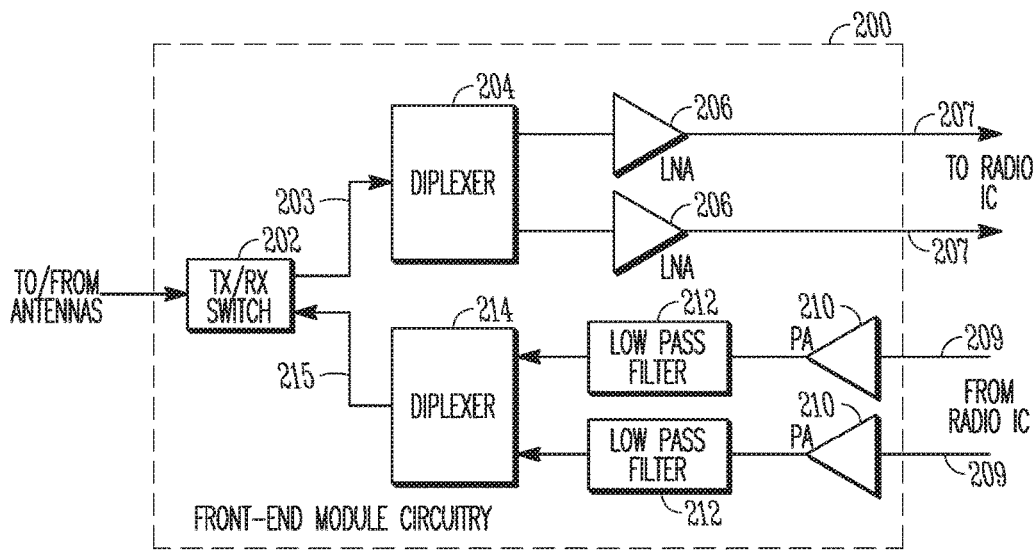
FIG. 2 illustrates front-end module circuitry in accordance with some embodiments.

FIG. 2 illustrates front-end module circuitry 200 in accordance with some embodiments. The front-end module circuitry 200 is one example of circuitry that may be suitable for use as the front-end module circuitry 104 (FIG. 1), although other circuitry configurations may also be suitable. In some embodiments, the front-end module circuitry 200 may include a TX/RX switch 202 to switch between transmit mode and receive mode operation. The front-end module circuitry 200 may include a receive signal path and a transmit signal path. The receive signal path of the front-end module circuitry 200 may include a low-noise amplifier (LNA) 206 to amplify received RF signals 203 and provide the amplified received RF signals 207 as an output (e.g., to the radio IC circuitry 106 (FIG. 1)). The transmit signal path of the front-end module circuitry 200 may include a power amplifier (PA) to amplify input RF signals 209 (e.g., provided by the radio IC circuitry 106), and one or more filters 212 to generate RF signals 215 for subsequent transmission (e.g., by one or more of the antennas 101 (FIG. 1)).

In some embodiments, the front-end module circuitry 200 may be configured to operate in multiple frequency bands. As a non-limiting example, either the 2.4 GHz frequency spectrum or the 5 GHz frequency spectrum may be used. As another example, more than two frequency bands may be used. In these embodiments, the receive signal path of the front-end module circuitry 200 may include a receive signal path diplexer 204 to separate the signals from each spectrum as well as a separate LNA 206 for each spectrum. In these embodiments, the transmit signal path of the front-end module circuitry 200 may also include a power amplifier 210 and a filter 210 for each frequency spectrum and a transmit signal path diplexer 214 to provide the signals of one of the different spectrums onto a single transmit path for subsequent transmission by the one or more of the antennas 101 (FIG. 1). These embodiments are not limiting, however, as the front-end module circuitry 200 may be configured to operate in one frequency band, in some cases.

Figure 3:
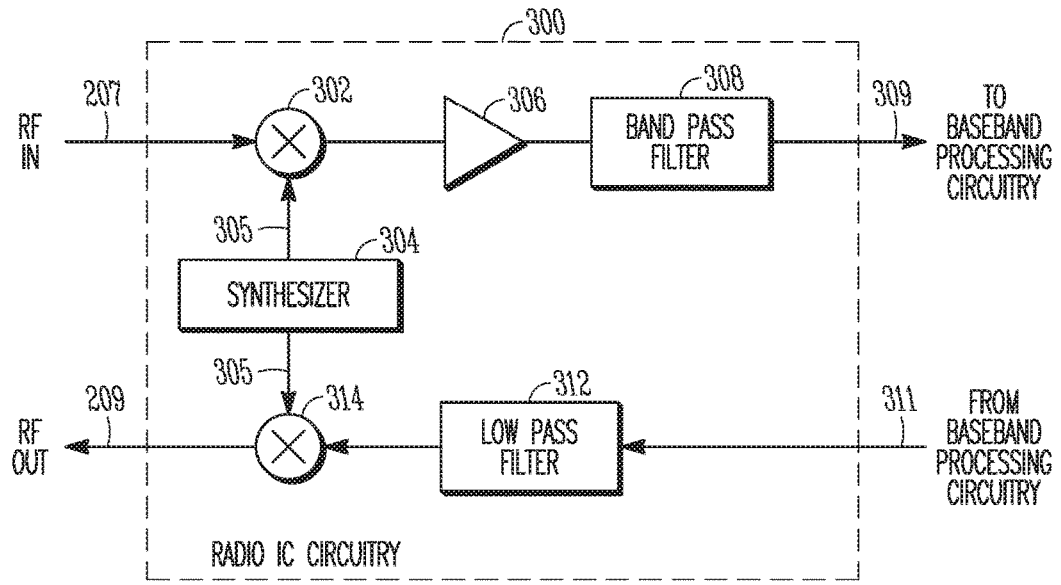
FIG. 3 illustrates radio IC circuitry in accordance with some embodiments.

FIG. 3 illustrates radio IC circuitry 300 in accordance with some embodiments. The radio IC circuitry 300 is one example of circuitry that may be suitable for use as the radio IC circuitry 106 (FIG. 1), although other circuitry configurations may also be suitable. In some embodiments, the radio IC circuitry 300 may include a receive signal path and a transmit signal path. The receive signal path of the radio IC circuitry 300 may include at least mixer circuitry 302, amplifier circuitry 306 and filter circuitry 308. The transmit signal path of the radio IC circuitry 300 may include at least filter circuitry 312 and mixer circuitry 314. Radio IC circuitry 300 may also include synthesizer circuitry 304 for synthesizing a frequency 305 for use by the mixer circuitry 302 and the mixer circuitry 314.

In some embodiments, mixer circuitry 302 may be configured to down-convert RF signals 207 received from the front-end module circuitry 104 (FIG. 1) based on the synthesized frequency 305 provided by synthesizer circuitry 304. The amplifier circuitry 306 may be configured to amplify the down-converted signals and the filter circuitry 308 may be a band-pass filter (BPF) configured to remove unwanted signals from the down-converted signals to generate output baseband signals 309. Output baseband signals 309 may be provided to the baseband processing circuitry 108 (FIG. 1) for further processing. In some embodiments, the output baseband signals 309 may be zero-frequency baseband signals, although this is not a requirement. In some embodiments, mixer circuitry 302 may comprise passive mixers, although the scope of the embodiments is not limited in this respect.

In some embodiments, the mixer circuitry 314 may be configured to up-convert input baseband signals 311 based the synthesized frequency 305 provided by the synthesizer circuitry 304 to generate RF output signals 209 for the front-end module circuitry 104. The baseband signals 311 may be provided by the baseband processing circuitry 108 and may be filtered by filter circuitry 312. The filter circuitry 312 may include a low-pass filter (LPF), although the scope of the embodiments is not limited in this respect.

In some embodiments, the output baseband signals 309 and the input baseband signals 311 may be analog baseband signals, although the scope of the embodiments is not limited in this respect. In some alternate embodiments, the output baseband signals 309 and the input baseband signals 311 may be digital baseband signals. In these alternate embodiments, the radio IC circuitry may include analog-to-digital converter (ADC) and digital-to-analog converter (DAC) circuitry. In some dual-mode embodiments, a separate radio IC circuitry may be provided for processing signals for each spectrum, although the scope of the embodiments is not limited in this respect.

Figure 4:
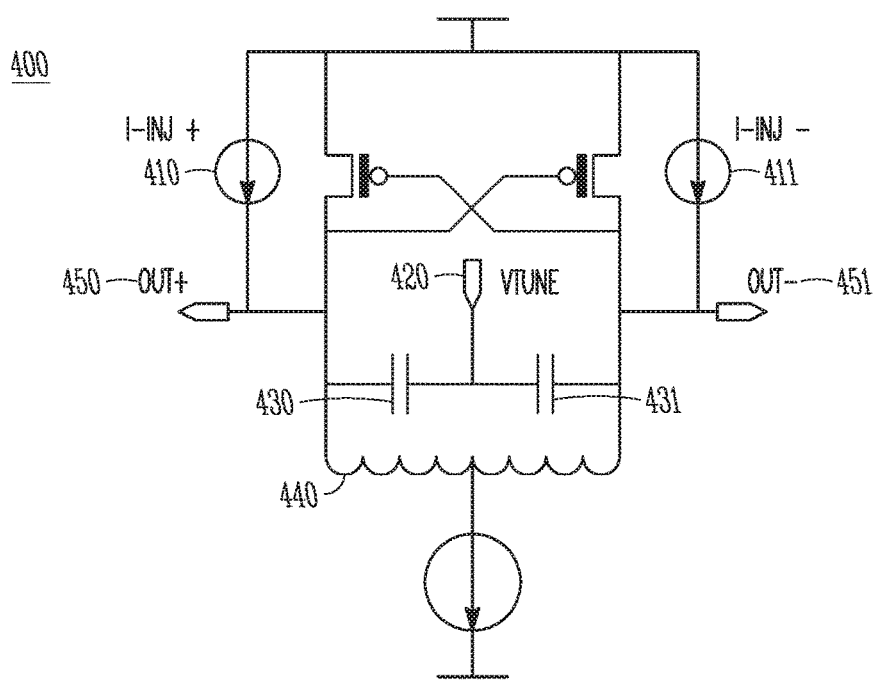
FIG. 4 illustrates an example of an injection locked multiplier (ILM) in accordance with some embodiments.

FIG. 4 illustrates an example of an injection locked multiplier (ILM) in accordance with some embodiments. It should be noted that concepts or techniques related to an ILM may be described in terms of the example ILM 400, but such description is not limiting. Some of the concepts or techniques may be applicable to other implementations of an ILM, in some embodiments. It should be noted that embodiments are not limited by the number, type or arrangement of components shown in the example ILM 400 in FIG. 4. Some embodiments of an ILM may include additional components or alternate components, and some embodiments may not necessarily include all components shown in the example ILM 400 in FIG. 4. In some embodiments, an ILM may include components in an arrangement that may be different from the arrangement shown in FIG. 4.

In some embodiments, an ILM (such as 400 or other) may provide a frequency multiplication of an input signal, such as a reference sinusoid or a reference clock. In some cases, the frequency multiplication may exhibit a relatively low phase noise in comparison to other techniques. The ILM may generate an output signal (such as a sinusoidal signal) that may be locked to a harmonic of the injected signal (input signal). In some cases, the harmonic may be relatively close to a resonant frequency (or natural frequency) of the ILM. As a non-limiting example, the resonant frequency of the ILM may be related to a resonant frequency of a group of components included in the ILM.

Referring to the example ILM 400 shown in FIG. 4, an input signal (or injected signal) may be input at 410, 411 and an output signal may be output at 450, 451. A tunable voltage source 420 may be used to tune a locking range of frequencies of the ILM 400. In the non-limiting example arrangement shown in FIG. 4, the tunable voltage source 420 may be connected to the capacitors 430, 431, which may be connected to the inductor 440. The inductor 440 and the capacitors 430, 431 may be part of an LC circuit that may have a resonant frequency related to capacitances of the capacitors 430, 431 and an inductance of the inductor 440. As an example, the input signal at 410, 411 may be a sinusoidal signal at an input frequency. A multiple of the input frequency may be within a locking range of the resonant frequency of the ILM 400 or a resonant frequency of the LC circuit. The output signal at 450, 451 may be a sinusoidal signal at the multiple of the input frequency. In some embodiments, a locking mechanism of the ILM 400 may depend on factors such as a difference between a natural oscillating frequency (resonant frequency) of the ILM 400 and a harmonic (multiple) of the input signal at 410, 411, circuit parameters, an amplitude difference between the input signal and other signals of the ILM 400 or other factors.

It should be noted that the ILM 400 shown in FIG. 4 is an example of a frequency multiplier that may be included in one or more embodiments described herein. In some embodiments, the ILM 400 (and/or other implementations of an ILM) may be included in the front-end module circuitry 104, radio IC circuitry 106 or elsewhere in the radio architecture 100. In addition, other devices, components or circuits may include one or more ILMs 400 in arrangements and/or configurations that may or may not be similar to that shown in FIG. 4. As an example, a different arrangement of capacitors and inductors may be used. As another example, other components, such as resistors and/or others, may be included.

Figure 5:
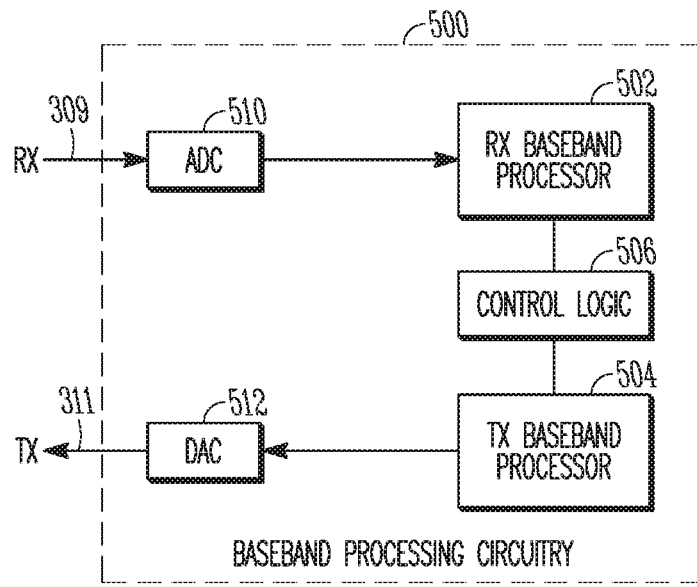
FIG. 5 illustrates a functional block diagram of baseband processing circuitry in accordance with some embodiments.

FIG. 5 illustrates a functional block diagram of baseband processing circuitry 500 in accordance with some embodiments. The baseband processing circuitry 500 is one example of circuitry that may be suitable for use as the baseband processing circuitry 108 (FIG. 1), although other circuitry configurations may also be suitable. The baseband processing circuitry 500 may include a receive baseband processor (RX BBP) 502 for processing receive baseband signals 309 provided by the radio IC circuitry 106 (FIG. 1) and a transmit baseband processor (TX BBP) 504 for generating transmit baseband signals 311 for the radio IC circuitry 106. The baseband processing circuitry 500 may also include control logic 506 for coordinating the operations with the baseband processing circuitry 500.

In some embodiments (e.g., when analog baseband signals are exchanged between the baseband processing circuitry 500 and the radio IC circuitry 106), the baseband processing circuitry 500 may include ADC 510 to convert analog baseband signals received from the radio IC circuitry 106 to digital baseband signals for processing by the RX BBP 502. In these embodiments, the baseband processing circuitry 500 may also include DAC 512 to convert digital baseband signals from the TX BBP 504 to analog baseband signals.

Referring to FIG. 1, in some embodiments, the antennas 101 (FIG. 1) may comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result.

Although the radio-architecture 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

In some embodiments, the radio architecture 100 may be part of a communication device such as a wireless local area network (WLAN) communication station (STA), a wireless access point (AP), user equipment (UE), an Evolved Node-B (eNB), a base station or a mobile device including a Wireless Fidelity (Wi-Fi) device. In some of these embodiments, radio architecture 100 may be configured to transmit and receive signals in accordance with specific communication standards, such as the Institute of Electrical and Electronics Engineers (IEEE) standards including IEEE 802.11-2012, 802.11n-2009, 802.11ac, and/or 802.11ax standards and/or proposed specifications for WLANs. In some embodiments, radio architecture 100 may be configured to transmit and receive signals in accordance with Third Generation Partnership Project (3GPP) standards including Long Term Evolution (LTE) standards. The scope of the embodiments is not limited in this respect, however, as the radio architecture 100 may also be suitable to transmit and/or receive communications in accordance with other techniques and standards. In addition, the radio architecture 100 may be configured to transmit and receive signals in multiple frequency bands in some embodiments.

In some embodiments, the radio architecture 100 may be part of a communication device such as a personal digital assistant (PDA), a laptop or portable computer with wireless communication capability, a web tablet, a wireless telephone, a smart-phone, a wireless headset, a pager, an instant messaging device, a digital camera, an access point, a television, a wearable device such as a medical device (e.g., a heart rate monitor, a blood pressure monitor, etc.), or other device that may receive and/or transmit information wirelessly. In some embodiments, the communication device may include one or more of a keyboard, a display, a non-volatile memory port, multiple antennas, a graphics processor, an application processor, speakers, and other mobile device elements. The display may be an LCD screen including a touch screen The communication device may be or may be configured to operate as a mobile device and/or a stationary non-mobile device. The communication device may also be, or may be part of, an apparatus for such a device. For instance, an AP may include the communication device in addition to other equipment, components or elements. It should also be noted that some embodiments may be related to other electrical devices, electrical circuits or other devices that may or may not be related to communication, as will be described below.

In accordance with some embodiments, a reference path circuit may include an injection locked multiplier (ILM) and a group of one or more buffer amplifiers. The ILM may receive a sinusoidal reference signal from a reference oscillator at a reference frequency. The ILM may generate a sinusoidal ILM output signal at an ILM output frequency that is based on an integer multiple of the reference frequency. The integer multiple of the reference frequency may be within a locking range of the ILM, and the locking range may be based on a resonant frequency of the ILM. The group of one or more buffer amplifiers may generate an output clock signal for input to the frequency synthesizer. The output clock signal may be based on a sign function of the ILM output signal. These embodiments will be described in more detail below.

Figure 6:
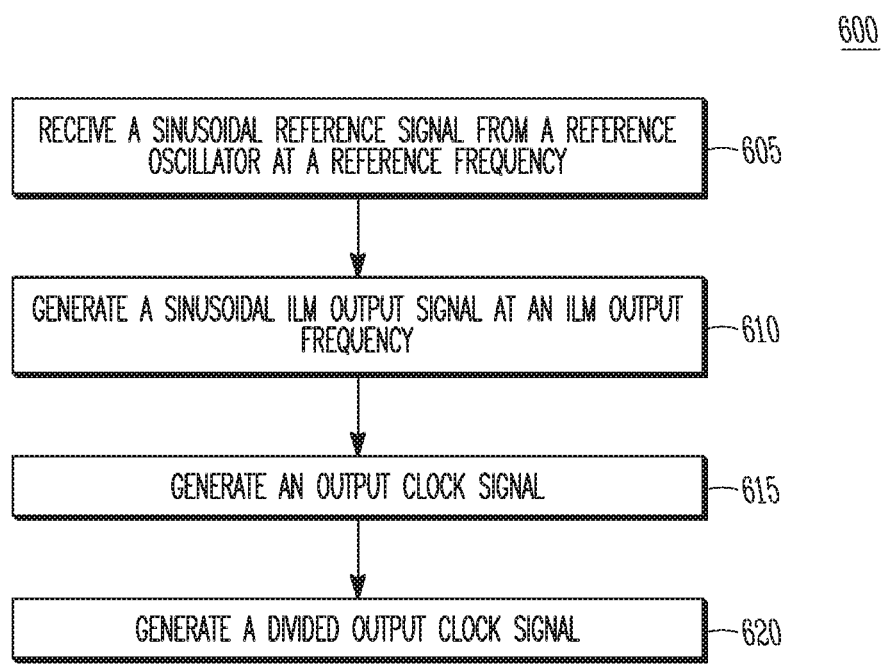
FIG. 6 illustrates the operation of an example method of generating an output clock signal in accordance with some embodiments.

FIG. 6 illustrates the operation of an example method of generating an output clock signal in accordance with some embodiments. It is important to note that embodiments of the method 600 may include additional or even fewer operations or processes in comparison to what is illustrated in FIG. 6. In addition, embodiments of the method 600 are not necessarily limited to the chronological order that is shown in FIG. 6. In describing the method 600, reference may be made to FIGS. 1-5 and 7-9, although it is understood that the method 600 may be practiced with any other suitable systems, interfaces and components. In addition, reference may be made to the ILM 400 as part of descriptions herein, such as descriptions of the techniques, operations and/or implementations of the method 600, other methods, the example circuits in FIGS. 7-9 and/or other circuits. However, it is understood that such references are not limiting, as some or all of the techniques, operations and/or implementations may be applicable to other embodiments of an ILM or other device, in some cases.

In some embodiments, the method 600 may be performed by a reference path circuit or by a device that includes the reference path circuit, although the scope of embodiments is not limited in this respect. In addition, some of the operations of the method 600 may be performed by different components of the reference path circuit, in some cases. For instance, a first component of the reference path circuit may perform a first portion of the operations and a second component of the reference path circuit may perform a second portion of the operations. It should be noted that embodiments are not limited to the first and second components of the reference path circuit. In some embodiments, more than two components may be included. Any suitable number of components of the reference path circuit may perform one or more operations, in some embodiments.

In some embodiments, the reference path circuit may connect an oscillator and a component, such as a frequency synthesizer or other component. As an example, a device may include the reference path circuit, oscillator, and frequency synthesizer in an arrangement and/or configuration in which an output of the oscillator is input to the reference path circuit, and an output of the reference path circuit is input to the frequency synthesizer.

In some embodiments, an output from a first component may be input to a second component. In some cases, the first and second components may be connected directly, such as through a wired connection, in which case the output from the first component may be input directly to the second component. In some cases, the first and second components may not necessarily be connected directly. For instance, one or more other components may be included in a path between the first and second components. Accordingly, the output from the first component may be affected, in some cases, by other components before being input to the second component. In such cases, the second component may receive the output from the first component indirectly. As an example, a filter may be included between the first and second components. It is understood that references to signals exchanged between components may include direct or indirect exchanges of the signals, in some embodiments.

At operation 605, a sinusoidal reference signal at a reference frequency may be received from a reference oscillator. In some embodiments, the reference signal may be received by an ILM 400 included in a reference path circuit. The reference frequency may be any suitable frequency value or may be included in any suitable frequency range. As an example, the reference frequency may be less than or equal to 50 MHz. As another example, the reference frequency may be approximately 50 MHz. Embodiments are not limited to these examples, however, as values such as 10 MHz, 20 MHz or other suitable values and/or ranges of values may be used in some embodiments.

At operation 610, the ILM 400 may generate a sinusoidal ILM output signal at an ILM output frequency. In some embodiments, the ILM output signal may be generated at an integer multiple of the reference frequency. It should be noted that the ILM output signal may be a sinusoidal signal at the integer multiple of the reference frequency, but the scope of embodiments is not limited in this respect. In some cases, the ILM output signal may be a sinusoidal signal at a frequency that is approximately or near to the integer multiple of the reference frequency.

In some embodiments, the integer multiple of the reference frequency may be within a locking range of the ILM 400. As an example, the locking range may be based on a resonant frequency of the ILM 400. For instance, the locking range may include the resonant frequency. In some embodiments, the locking range of the ILM 400 may be tunable. As an example, referring to FIG. 4, the ILM 400 may be tuned based on a voltage of a tunable voltage source 420. The voltage source 420 may be connected to a circuit, such as an circuit or other circuit, and the locking range may be based on a resonant frequency of the LC circuit or other circuit. For instance, the LC circuit may include the capacitors 430 and 431 and the inductor 440 in the ILM 400.

As another example, the voltage of the tunable voltage source may be tuned, for the generation of the output clock signal, to a voltage at which the locking range of the ILM 400 includes the integer multiple of the reference frequency. As another example, the tunable voltage source may be external to the ILM 400. As another example, the tunable voltage source may be included as part of the ILM 400.

In some embodiments, the generation of the ILM output signal at the ILM output frequency may be performed to enable an increase in a slew rate of the ILM output signal in comparison to a slew rate of the reference signal. The slew rate may be or may be related to a rate of change of the signal with respect to time.

At operation 615, one or more output clock signals may be generated. In some embodiments, a group of buffer amplifiers may generate an output clock signal based on the ILM output signal. As an example, the ILM output signal may be input to the group of buffer amplifiers which may generate the output clock signal. In some embodiments, the output clock signal may be based on a sign function of the ILM output signal. In some embodiments, the output clock signal may be generated for input to a frequency synthesizer or other device.

The reference path circuit may include the ILM 400 and the group of one or more buffer amplifiers. In some embodiments, the group may include at least a first buffer amplifier and a last buffer amplifier. As an example, the buffer amplifiers in the group may be arranged and/or configured in a serial arrangement that includes the first and last buffer amplifiers. It should be noted that embodiments are not limited to a first and last buffer amplifier, however, as any suitable number of buffer amplifiers may be included in the group. It should also be noted that in some embodiments, a single buffer amplifier may be used. In such embodiments, the ILM output signal may be input to the single buffer amplifier and the output clock signal may be or may be based on the output of the single buffer amplifier.

In some embodiments, the buffer amplifiers in the group may be arranged and/or configured in a serial arrangement in which a first buffer amplifier in the group is arranged and/or configured to receive the ILM output signal and to generate a first output clock signal to be output to another buffer amplifier in the group. A fundamental frequency of the first output clock signal may be or may be based on a multiple of the ILM output signal or a harmonic of the ILM output signal. As previously described, the frequency of the ILM output signal may be a multiple of the reference frequency from the reference oscillator, in some cases. In some cases, an output phase noise of the first buffer amplifier (such as phase noise on the first output clock signal) in response to a sinusoidal input signal may vary according to a substantially non-increasing relationship with a slew rate of the sinusoidal input signal. Accordingly, when the input signal to the first buffer amplifier is at a multiple of the reference frequency, a level of phase noise of the first output clock signal may be less than another level of phase noise that may result when the input signal is at the reference frequency.

In some embodiments, the first output clock signal from the first buffer amplifier may be input to a next buffer amplifier in the group, such as a second buffer amplifier in a serial arrangement. The buffer amplifiers in the group (with the exception of the first buffer amplifier) may receive, as input, a clock signal from a previous buffer amplifier. The buffer amplifiers in the group (with the exception of the last buffer amplifier) may output a clock signal to a next buffer amplifier. The last buffer amplifier may output a last output clock signal. At each stage, each buffer amplifier may generate an output signal that is or is based on a sign function of the input signal to the buffer amplifier, in some cases.

In some cases, the output of the reference path circuit may be or may be based on the last output clock signal from the last buffer amplifier. Accordingly, a fundamental frequency of the output signal of the reference path circuit may be a multiple of the reference frequency (or approximately equal to the multiple of the reference frequency), in some cases.

At operation 620, the last output clock signal or the output signal from the group of buffer amplifiers may be divided in frequency by a frequency divider. Accordingly, in some embodiments, a frequency divider may be included as part of the reference path circuit. As an example, the frequency divider may be based on a multiplier of the ILM 400. That is, the ILM 400 may operate as a frequency multiplier, as described earlier, in which the ILM output signal is at a multiple of the reference frequency. The multiple may be used by the frequency divider to convert the last output clock signal to a frequency divided clock signal. A fundamental frequency of the frequency divided clock signal may be equal to or approximately equal to the reference frequency, in some cases.

It should be noted that in some embodiments, the frequency divided clock signal may be input to the frequency synthesizer or other device, in which case operation 620 may be performed. In some embodiments, the frequency divider may be excluded from the reference path circuit and the method 600 may exclude operation 620. Accordingly, in such embodiments, the output of the reference path circuit may be a clock signal for which a fundamental frequency may be equal to or approximately equal to the multiple of the reference frequency.

In some embodiments, the reference path circuit may include one or more components as described herein (such as one or more ILMs 400, buffer amplifiers or frequency dividers). In some embodiments, the reference path circuit may include other components, including but not limited to one or more low dropout (LDO) regulators, direct current (DC) power supplies or other components.

It should be noted that in some cases, the ILM 400 may be included in the reference path circuit to enable a reduction in a phase noise of the clock signal output from the reference path circuit. Accordingly, the ILM 400 may convert the sinusoidal reference signal at a reference frequency to a sinusoidal ILM output signal at a higher frequency than the reference frequency. The ILM output signal may be input to a first buffer amplifier in a group. A slew rate of the ILM output signal may be higher than a slew rate of the reference signal, and a resulting phase noise for a first output clock signal of the first buffer amplifier may be lower than if the reference signal were input to the first buffer amplifier. The reduction in the phase noise at the first stage (first buffer amplifier) in a chain of buffer amplifiers may result in an overall reduction in phase noise of the last output clock signal output from the last buffer amplifier.

Figure 7:
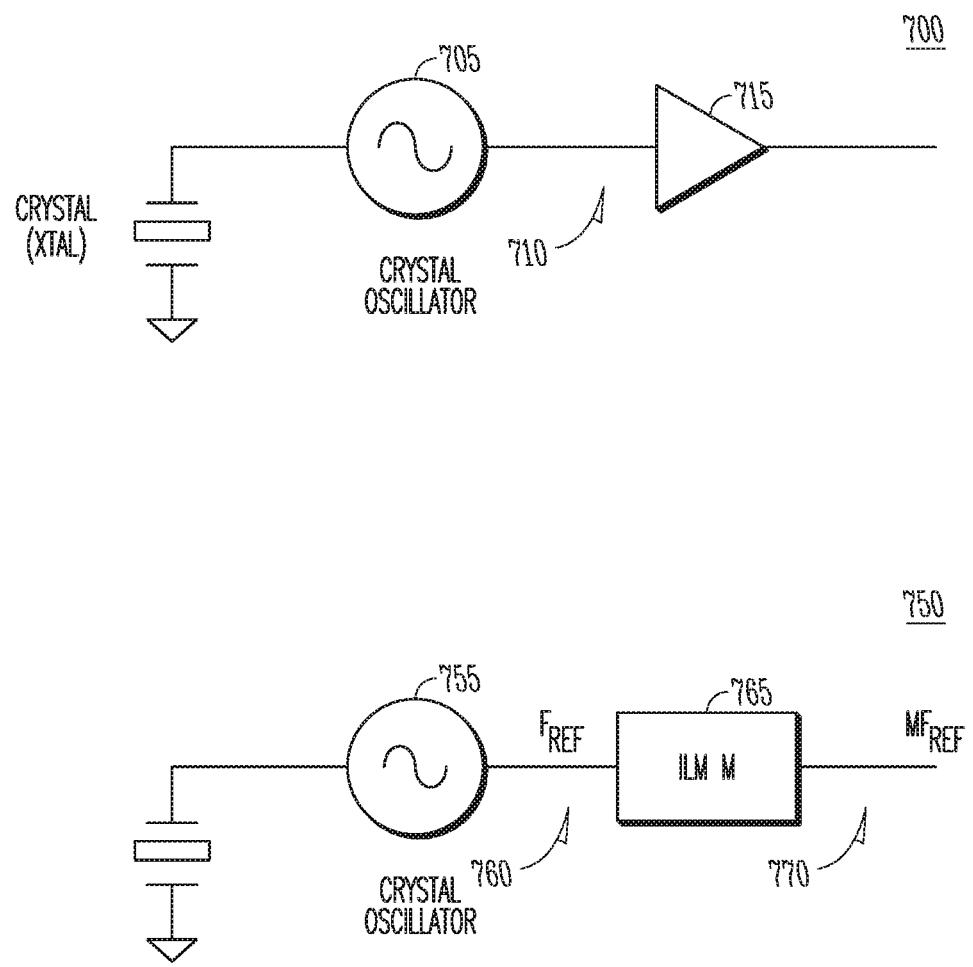
FIG. 7 illustrates example circuits in accordance with some embodiments.
Figure 8:
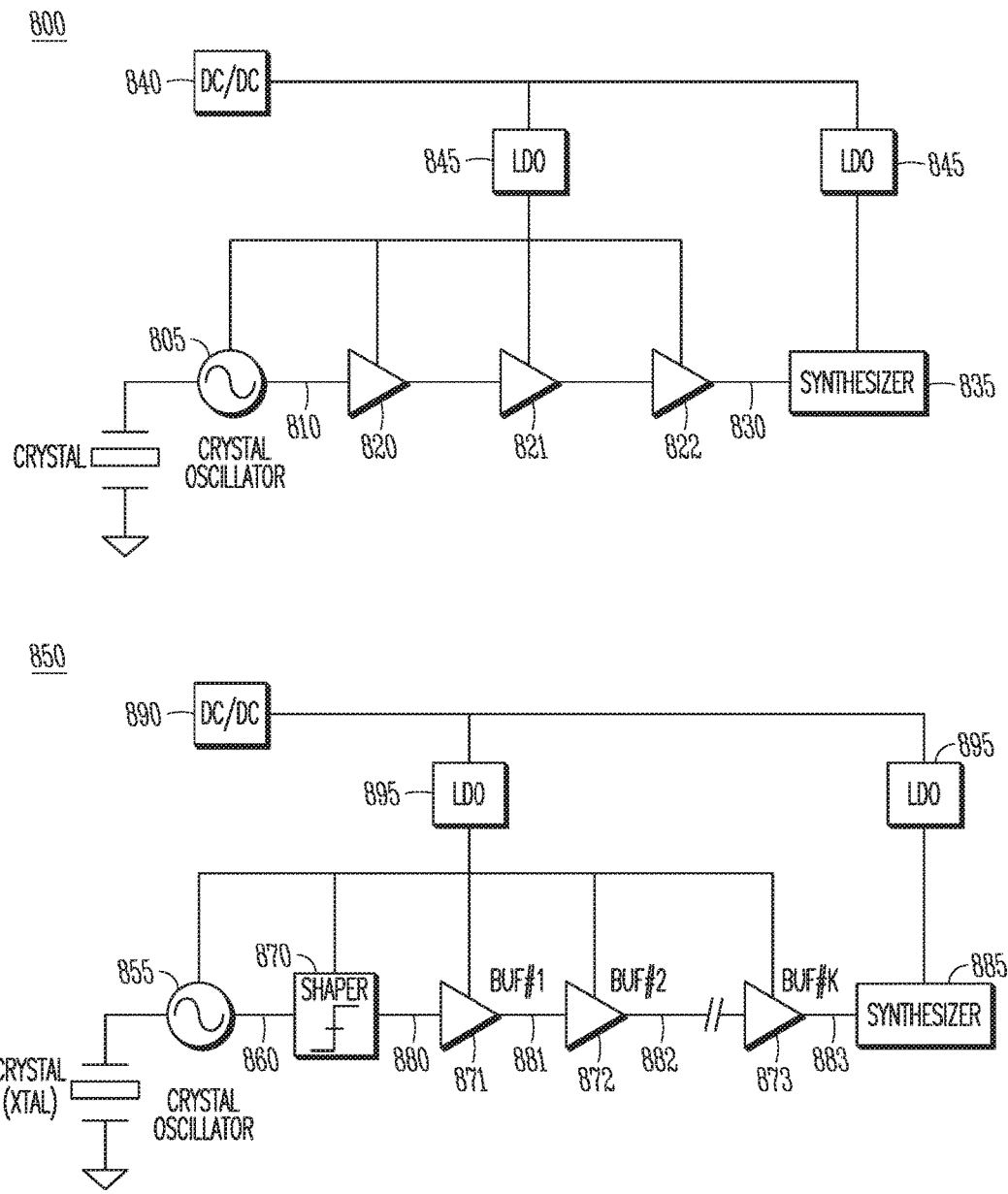
FIG. 8 illustrates additional example circuits in accordance with some embodiments.
Figure 9:
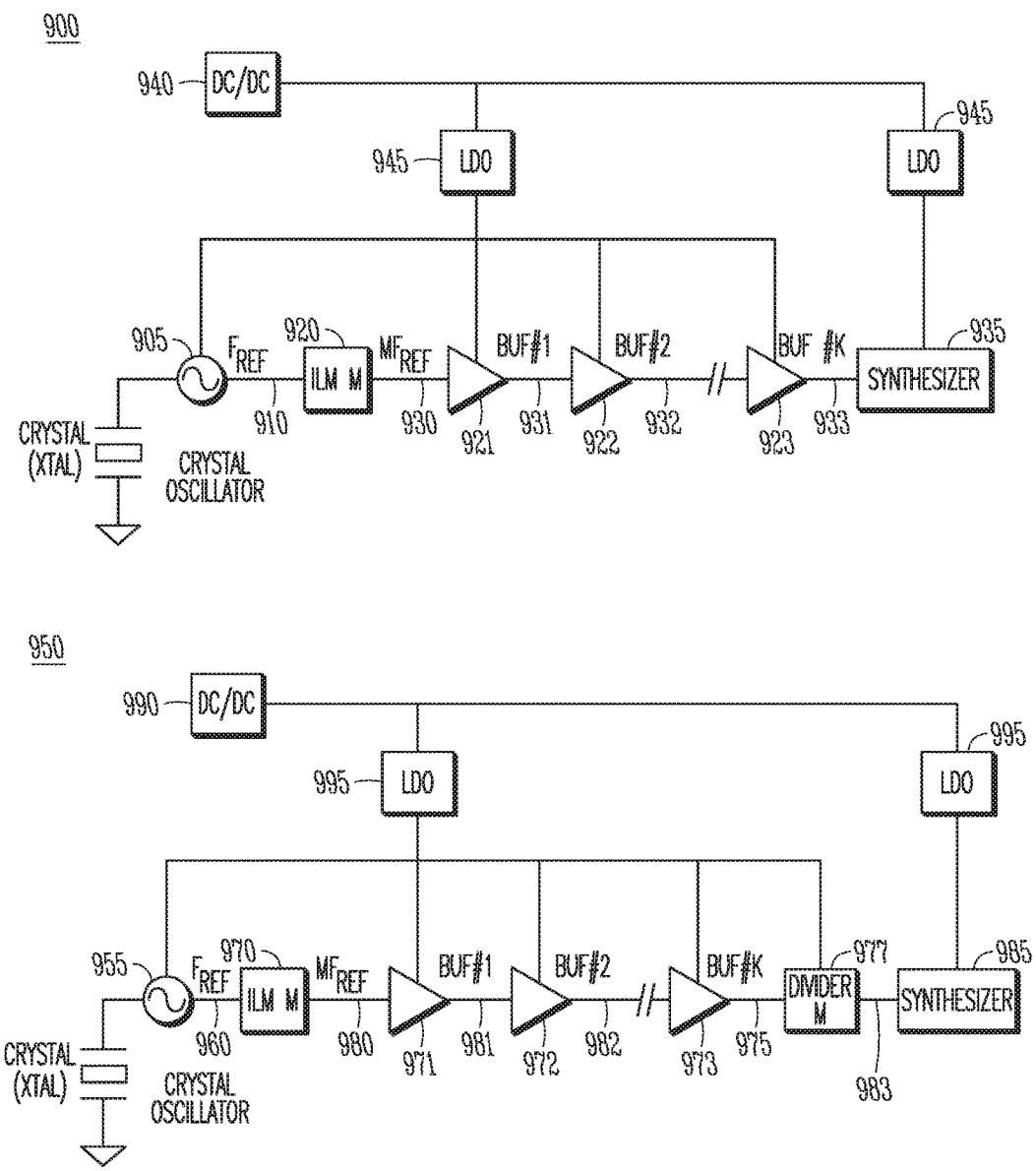
FIG. 9 illustrates additional example circuits in accordance with some embodiments.

FIGS. 7-9 illustrate example circuits in accordance with some embodiments. It should be noted that embodiments are not limited by any of the example circuits shown in FIGS. 7-9, although some of those example circuits may illustrate some or all of the concepts described herein. Embodiments are not limited by the number, type or arrangement of components shown in the example circuits of FIGS. 7-9. Some embodiments may include one or more components of one or more of the example circuits. Some embodiments may include additional components, alternative components or similar components. Some embodiments may not necessarily include all of the components shown in any of the example circuits.

In some embodiments, the ILM 400 may be used in circuits such as the example circuits shown in FIGS. 7-9 or other circuits. The scope of embodiments is not limited in this respect, however, as other ILM components may be used in some embodiments. It should also be noted that references may be made to the 400 as part of descriptions of techniques, operations and/or implementations of the example circuits in FIGS. 7-9 and/or other descriptions herein. However, it is understood that such references are not limiting, and some or all of the techniques, operations and/or implementations may be applicable to other embodiments of an ILM or other device, in some cases.

In some embodiments, a reference path circuit may be or may be part of an integrated circuit or integrated component. Accordingly, some or all elements of the reference path circuit may be internal to the reference path circuit. In some cases, some or all of the elements of the reference path circuit may be arranged and/or configured in a semi-permanent manner.

Referring to FIG. 7, in the example circuit 700, a crystal oscillator 705 may generate a sinusoidal signal at 710, which may be input to a buffer amplifier 715. In the example circuit 750, the crystal oscillator 755 may generate a sinusoidal signal at 760 at a reference frequency "Fref," which may be input to the ILM 765. The ILM 765 may be tuned so that a locking range includes M*Fref, a multiple of Fref. Accordingly, the output 770 of the ILM 765 may be a sinusoidal signal at a frequency of M*Fref or approximately M*Fref.

Referring to FIG. 8, in the example circuit 800, the crystal oscillator 805 may generate a sinusoidal signal at a reference frequency at 810, which may be input to a chain of buffer amplifiers 820-822. It should be noted that embodiments are not limited to three buffer amplifiers, as more or fewer than three may be used in some cases. The buffer amplifiers 820-822 may output clock signals for which a fundamental frequency is equal to or approximately equal to the reference frequency. The output signal 830 of the final buffer amplifier 822 may be input to the frequency synthesizer 835. The output signal at 830 may be a clock signal, and a fundamental frequency of the clock signal alt 830 may be equal to or approximately equal to the reference frequency. In some cases, each of the multiple stages, such as the buffer amplifiers 820-822, may add a phase noise contribution to the output signal at 830.

In the example circuit 850, the crystal oscillator 855 may generate a sinusoidal signal at a reference frequency at 860, which may be input to a shaper 870, the output of which may be input to the chain of buffer amplifiers 871-873. It should be noted that embodiments are not limited to three buffer amplifiers, as more or fewer than three may be used in some cases. The shaper 870 and the buffer amplifiers 871-873 may output clock signals for which a fundamental frequency is equal to or approximately equal to the reference frequency. The output signal 883 of the final buffer amplifier 873 may be input to the frequency synthesizer 885. The output signal at 883 may be a clock signal, and a fundamental frequency of the clock signal at 883 may be equal to or approximately equal to the reference frequency. In some cases, each of the multiple stages, such as the shaper 870 and the buffer amplifiers 871-873, may add a phase noise contribution to the output signal at 883.

In the example circuit 900, the crystal oscillator 905 may generate a sinusoidal signal at a reference frequency at 910, which may be input to an ILM 920, the output of which may be input to the chain of buffer amplifiers 921-923. The ILM output at 930 may be a sinusoidal signal at a frequency that may be or may be approximately a multiple of the reference frequency (such as the value "M" as indicated by 920). It should be noted that embodiments are not limited to three buffer amplifiers, as more or fewer than three may be used in some cases. The buffer amplifiers 921-923 may output clock signals for which a fundamental frequency is equal to or approximately equal to the product of "M" and the reference frequency. The output signal 933 of the final buffer amplifier 923 may be input to the frequency synthesizer 935. The output signal at 933 may be a clock signal, and a fundamental frequency of the clock signal at 933 may be equal to or approximately equal to a product of "M" and the reference frequency. In some cases, each of the multiple stages, such as the buffer amplifiers 921-923, may add a phase noise contribution to the output signal at 933. In some cases, the conversion of the signal at 920 at the reference frequency to the signal at 930 at the multiple of the reference frequency may enable a reduction in phase noise at the output signal 933.

In the example circuit 950, the crystal oscillator 955 may generate a sinusoidal signal at 960 at a reference frequency, which may be input to an ILM 970, the output of which may be input to the chain of buffer amplifiers 971-973. The ILM output at 980 may be a sinusoidal signal at a frequency that may be or may be approximately a multiple of the reference frequency (such as the value "M" as indicated by 970). It should be noted that embodiments are not limited to three buffer amplifiers, as more or fewer than three may be used in some cases. The buffer amplifiers 971-973 may output clock signals for which a fundamental frequency is equal to or approximately equal to the product of "M" and the reference frequency. The output signal 975 of the final buffer amplifier 973 may be input to the frequency divider 977. As indicated in FIG. 9, the frequency divider 977 may divide an input frequency by "M." In some embodiments, for a frequency division by "M," a fundamental frequency of an output signal may be equal to or approximately equal to a fundamental frequency of the input signal divided by "M." The output signal at 975 may be a clock signal, and a fundamental frequency of the clock signal at 975 may be equal to or approximately equal to a product of "M" and the reference frequency. The output signal at 983 output from the frequency divider 977 may be a clock signal, and a fundamental frequency of the clock signal at 983 may be equal to or approximately equal to the reference frequency. In some cases, each of the multiple stages, such as the buffer amplifiers 971-973, may add a phase noise contribution to the output signal at 975. In some cases, the conversion of the signal at 960 at the reference frequency to the signal at 980 at the multiple of the reference frequency may enable a reduction in phase noise at the output signals 975 or 983.

It should also be noted that some of the components or techniques disclosed herein, such as the ILM 400, other embodiments of an ILM or the reference path circuits, may be included and/or used in other devices that may or may not be related to communication devices. As an example, a radio or television receiver may include one or more ILMs, reference path circuits or frequency synthesizers for tuning of a carrier frequency to a channel or for other tasks. As another example, an oscilloscope, a spectrum analyzer or other test equipment may use a frequency synthesizer to provide sinusoidal signals or clock signals at various frequencies, and may include a reference path circuit for the frequency synthesizer as described herein.

In Example 1, a reference path circuit for a frequency synthesizer may comprise an injection locked multiplier (ILM). The ILM may receive a sinusoidal reference signal from a reference oscillator at a reference frequency. The ILM may generate a sinusoidal ILM output signal at an ILM output frequency that is based on an integer multiple of the reference frequency. The integer multiple of the reference frequency may be within a locking range of the ILM, and the locking range may be based on a resonant frequency of the ILM. The reference path circuit may further comprise a group of one or more buffer amplifiers. The group of one or more buffer amplifiers may generate an output clock signal for input to the frequency synthesizer, the output clock signal based on a sign function of the ILM output signal.

In Example 2, the subject matter of Example 1, wherein the ILM may be included in the reference path circuit to enable a reduction in a phase noise of the output clock signal.

In Example 3, the subject matter of one or any combination of Examples 1-2, wherein the locking range of the ILM may be tunable based on a voltage of a tunable voltage source.

In Example 4, the subject matter of one or any combination of Examples 1-3, wherein the voltage of the tunable voltage source may be tuned, for the generation of the output clock signal, to a voltage at which the locking range of the ILM includes the integer multiple of the reference frequency.

In Example 5, the subject matter of one or any combination of Examples 1-4, wherein the ILM may include an LC circuit that includes an inductor and one or more capacitors arranged in a loop. The tunable voltage source may be connected to at least one of the capacitors.

In Example 6, the subject matter of one or any combination of Examples 1-5, wherein the tunable voltage source may be external to the In Example 7, the subject matter of one or any combination of Examples 1-6, wherein the generation of the ILM output signal at the ILM output frequency is to enable an increase in a slew rate of the ILM output signal in comparison to a slew rate of the reference signal.

In Example 8, the subject matter of one or any combination of Examples 1-7, wherein the slew rate of the ILM output signal may be based on a time rate of change of the ILM output signal.

In Example 9, the subject matter of one or any combination of Examples 1-8, wherein a first buffer amplifier in the group may be arranged to receive the ILM output signal. The first buffer amplifier in the group may generate a first output clock signal in response to the reception of the ILM output signal.

In Example 10, the subject matter of one or any combination of Examples 1-9, wherein an output phase noise of the first buffer amplifier in response to a sinusoidal input signal may vary according to a substantially non-increasing relationship with a slew rate of the sinusoidal input signal.

In Example 11, the subject matter of one or any combination of Examples 1-10, wherein the buffer amplifiers in the group may be arranged in a serial arrangement that includes at least a first buffer amplifier and a last buffer amplifier. The first buffer amplifier may be arranged to receive a first buffer input signal that is based on the ILM output signal. The first buffer amplifier may generate a first output clock signal based on a sign function of the first buffer input signal. The last buffer amplifier may be arranged to receive a last buffer input signal based on an output clock signal of a previous buffer amplifier in the serial arrangement. The last buffer amplifier may be generate a last output clock signal based on a sign function of the last buffer input signal. The output clock signal for input to the frequency synthesizer may be based on the last output clock signal.

In Example 12, the subject matter of one or any combination of Examples 1-11, wherein a fundamental frequency of the output clock signal for input to the frequency synthesizer may be substantially equal to the integer multiple of the reference frequency.

In Example 13, the subject matter of one or any combination of Examples 1-12, wherein the reference path circuit may further comprise a frequency divider to generate, for input to the frequency synthesizer, a frequency divided clock signal based on the output clock signal from the group of buffer amplifiers. A fundamental frequency of the frequency divided clock signal may be substantially equal to the reference frequency.

In Example 14, the subject matter of one or any combination of Examples 1-13, wherein the reference frequency may be not greater than 50 MHz.

In Example 15, a reference path circuit may comprise an injection locked multiplier (ILM). The reference path circuit may further comprise a group of buffer amplifiers. The ILM may be arranged to receive, from a reference oscillator, an input sinusoidal reference signal at a reference frequency. The ILM may generate, for input to a first buffer amplifier in the group, a sinusoidal ILM output signal at an integer multiple of the reference frequency. The first buffer amplifier in the group may be arranged to receive the ILM output signal. The first buffer amplifier in the group may generate, for output to a next buffer amplifier in the group, a first output clock signal based on a sign function of the ILM output signal. A final buffer amplifier in the group may be arranged to receive a previous clock signal from a previous buffer amplifier in the group. The final buffer amplifier in the group may generate a last clock signal based on a sign function of the previous clock signal.

In Example 16, the subject matter of Example 15, wherein the last clock signal may be generated for input to a frequency synthesizer.

In Example 17, the subject matter of one or any combination of Examples 15-16, wherein the integer multiple of the reference frequency may be within a locking range of the ILM. The locking range may be based on a resonant frequency of the ILM. The locking range of the ILM may be tunable based on a voltage of a tunable voltage source.

In Example 18, the subject matter of one or any combination of Examples 15-17, wherein the voltage of the tunable voltage source may be tuned, for the generation of the output clock signal, to a voltage at which the locking range of the ILM includes the integer multiple of the reference frequency.

In Example 19, a communication device may comprise a frequency synthesizer to generate, based on an output clock signal of a reference path circuit, a sinusoidal up-conversion signal to convert a baseband signal to a radio frequency (RF) signal for transmission. The communication device may further comprise the reference path circuit, which may comprise an injection locked multiplier (ILM) and a group of one or more buffer amplifiers. The ILM may be arranged to receive a sinusoidal reference signal from a reference oscillator at a reference frequency. The ILM may generate a sinusoidal ILM output signal at an ILM output frequency that is based on an integer multiple of the reference frequency. The integer multiple of the reference frequency may be within a locking range of the ILM, and the locking range may be based on a resonant frequency of the ILM. The group of one or more buffer amplifiers may generate the output clock signal of the reference path circuit, based on a sign function of the ILM output signal.

In Example 20, the subject matter of Example 19, wherein the communication device may further comprise a baseband processor to generate the baseband signal based on a group of data bits.

In Example 21, the subject matter of one or any combination of Examples 19-20, wherein the locking range of the ILM may be tunable based on a voltage of a tunable voltage source. The voltage of the tunable voltage source may be tuned, for the generation of the output clock signal, to a voltage at which the locking range of the ILM includes the integer multiple of the reference frequency.

In Example 22, the subject matter of one or any combination of Examples 19-21, wherein the buffer amplifiers in the group may be arranged in a serial arrangement that includes at least a first buffer amplifier and a last buffer amplifier. The first buffer amplifier may be arranged to receive a first buffer input signal that is based on the ILM output signal. The first buffer amplifier may generate a first output clock signal based on a sign function of the first buffer input signal. The last buffer amplifier may be arranged to receive a last buffer input signal based on an output clock signal of a previous buffer amplifier in the serial arrangement. The last buffer amplifier may generate a last output clock signal based on a sign function of the last buffer input signal. The output clock signal for input to the frequency synthesizer may be based on the last output clock signal.

In Example 23, a method of generating an output clock signal by a reference path circuit may comprise receiving, by an injection locked multiplier (ILM) of the reference path circuit, a sinusoidal reference signal from a reference oscillator at a reference frequency. The method may further comprise generating, by ILM, a sinusoidal ILM output signal at an ILM output frequency that is based on an integer multiple of the reference frequency. The method may further comprise generating, by a group of one or more buffer amplifiers of the reference path circuit, the output clock signal based on a sign function of the ILM output signal. The integer multiple of the reference frequency may be within a locking range of the ILM, and the locking range is based on a resonant frequency of the ILM.

In Example 24, the subject matter of Example 23, wherein the ILM may be included in the reference path circuit to enable a reduction in a phase noise of the output clock signal.

In Example 25, a reference path circuit may comprise means for receiving, by an injection locked multiplier (ILM) of the reference path circuit, a sinusoidal reference signal from a reference oscillator at a reference frequency. The reference path circuit may further comprise means for generating, by the ILM, a sinusoidal ILM output signal at an ILM output frequency that is based on an integer multiple of the reference frequency. The reference path circuit may further comprise means for generating, by a group of one or more buffer amplifiers of the reference path circuit, the output clock signal based on a sign function of the ILM output signal. The integer multiple of the reference frequency may be within a locking range of the ILM, and the locking range is based on a resonant frequency of the ILM.

In Example 26, the subject matter of Example 25, wherein the ILM may be included in the reference path circuit to enable a reduction in a phase noise of the output clock signal.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A reference path circuit for a frequency synthesizer, the reference path circuit comprising:
   an injection locked multiplier (ILM) to:
      receive, at an input of the ILM, a sinusoidal reference signal from a reference oscillator at a reference frequency; and
      generate, at an output of the ILM, a sinusoidal ILM output signal at an ILM output frequency that is based on an integer multiple of the reference frequency, the sinusoidal ILM output signal being generated with a higher slew rate than the reference signal,
      wherein the integer multiple of the reference frequency is within a locking range of the ILM, and the locking range is based on a resonant frequency of the ILM and the integer multiple of the reference frequency; and
   a group of one or more buffer amplifiers arranged serially and including at least a first buffer amplifier, the first buffer amplifier configured to receive the sinusoidal ILM output signal and to generate a first output clock signal such that (i) a level of phase noise associated with the first output clock signal when receiving the sinusoidal ILM output signal at the integer multiple of the reference frequency is less than (ii) a level of phase noise associated with first output clock signal when receiving the sinusoidal ILM output signal at the reference frequency, and to generate an output clock signal for input to the frequency synthesizer based upon the first output clock signal, the output clock signal being based on a sign function of the sinusoidal ILM output signal.

2. The reference path circuit according to claim 1, wherein the ILM is included in the reference path circuit to enable a reduction in a phase noise of the output clock signal.

3. The reference path circuit according to claim 1, wherein the locking range of the ILM is tunable based on a voltage of a tunable voltage source.

4. The reference path circuit according to claim 3, wherein the voltage of the tunable voltage source is tuned, for the generation of the output clock signal, to a voltage at which the locking range of the ILM includes the integer multiple of the reference frequency.

5. The reference path circuit according to claim 3, wherein:
   the ILM includes an LC circuit that includes an inductor and one or more capacitors arranged in a loop, and
   the tunable voltage source is connected to at least one of the capacitors.

6. The reference path circuit according to claim 3, wherein the tunable voltage source is external to the ILM.

7. The reference path circuit according to claim 1, wherein an output phase noise of the first buffer amplifier in response to receiving the sinusoidal ILM output signal varies according to a substantially non-increasing relationship with a slew rate of the sinusoidal ILM output signal.

8. The reference path circuit according to claim 1, wherein:
   the group of one or more buffer amplifiers includes a last buffer amplifier, wherein:
      the last buffer amplifier is arranged to receive a last buffer input signal based on an output clock signal of a previous buffer amplifier in the serial arrangement of the group of one or more buffer amplifiers, and
      to generate the output clock signal for input to the frequency synthesizer.

9. The reference path circuit according to claim 1, wherein a fundamental frequency of the output clock signal for input to the frequency synthesizer is substantially equal to the integer multiple of the reference frequency.

10. The reference path circuit according to claim 1, wherein the reference path circuit further comprises a frequency divider to:
    generate, for input to the frequency synthesizer, a frequency divided clock signal based on the output clock signal from the group of one or more buffer amplifiers, wherein a fundamental frequency of the frequency divided clock signal is substantially equal to the reference frequency.

11. The reference path circuit according to claim 1, wherein the reference frequency is not greater than 50 MHz.

12. A reference path circuit, the reference path circuit comprising:
    an injection locked multiplier (ILM) configured to receive, from a reference oscillator, an input sinusoidal reference signal at a reference frequency at an input of the ILM and generate, for input to a first buffer amplifier in a group of buffer amplifiers, a sinusoidal ILM output signal at an integer multiple of the reference frequency, the sinusoidal ILM output signal being generated with a higher slew rate than the reference signal;
    the first buffer amplifier configured to receive the sinusoidal ILM output signal and generate, for output to a next buffer amplifier in the group of buffer amplifiers, a first output clock signal based on a sign function of the sinusoidal ILM output signal such that (i) a level of phase noise associated with the first output clock signal when receiving the sinusoidal ILM output signal at the integer multiple of the reference frequency is less than (ii) a level of phase noise associated with first output clock signal when receiving the sinusoidal ILM output signal at the reference frequency, and
    wherein a final buffer amplifier in the group of buffer amplifiers is configured to receive a previous clock signal from a previous buffer amplifier in the group of buffer amplifiers and to generate a last clock signal based on a sign function of the previous clock signal.

13. The reference path circuit according to claim 12, wherein the last clock signal is generated for input to a frequency synthesizer.

14. The reference path circuit according to claim 12, wherein:
    the integer multiple of the reference frequency is within a locking range of the ILM, and the locking range is based on a resonant frequency of the ILM, and
    the locking range of the ILM is tunable based on a voltage of a tunable voltage source.

15. The reference path circuit according to claim 14, wherein the voltage of the tunable voltage source is tuned, for the generation of the first output clock signal, to a voltage at which the locking range of the ILM includes the integer multiple of the reference frequency.

16. A communication device, comprising:
a frequency synthesizer configured to generate, based on an output clock signal of a reference path circuit, a sinusoidal up-conversion signal to convert a baseband signal to a radio frequency (RF) signal for transmission;
the reference path circuit comprising an injection locked multiplier (ILM) and a group of one or more buffer amplifiers,
wherein the ILM is configured to receive a sinusoidal reference signal from a reference oscillator at a reference frequency at an input of the ILM, and to generate a sinusoidal ILM output signal at an ILM output frequency that is based on an integer multiple of the reference frequency, the sinusoidal ILM output signal being generated with a higher slew rate than the reference signal,
wherein the integer multiple of the reference frequency is within a locking range of the ILM, and the locking range is based on a resonant frequency of the ILM, and
wherein the group of one or more buffer amplifiers include at least a first buffer amplifier, the first buffer amplifier configured to receive the sinusoidal ILM output signal and to generate a first output clock signal such that (i) a level of phase noise associated with the first output clock signal when receiving the sinusoidal ILM output signal at the integer multiple of the reference frequency is less than (ii) the phase noise associated with first output clock signal when receiving the sinusoidal ILM output signal at the reference frequency, the group of one or more buffer amplifiers configured to generate the output clock signal of the reference path circuit based on a sign function of the sinusoidal ILM output signal.

17. The communication device according to claim 16, further comprising a baseband processor configured to generate the baseband signal.

18. The communication device according to claim 16, wherein:
the locking range of the ILM is tunable based on a voltage of a tunable voltage source, and the voltage of the tunable voltage source is tuned, for the generation of the output clock signal, to a voltage at which the locking range of the ILM includes the integer multiple of the reference frequency.

19. The communication device according to claim 16, wherein:
the group of one or more buffer amplifiers are arranged in a serial arrangement, wherein:
the last buffer amplifier is arranged to receive a last buffer input signal based on an output clock signal of a previous buffer amplifier in the serial arrangement, and
the output clock signal for input to the frequency synthesizer based on the last output clock signal.

20. A method of generating an output clock signal by a reference path circuit, the method comprising:
receiving, by an injection locked multiplier (ILM) of the reference path circuit, a sinusoidal reference signal from a reference oscillator at a reference frequency at an input of the ILM directly coupled to an output of the ILM;
generating, by the ILM, a sinusoidal ILM output signal at an ILM output frequency that is based on an integer multiple of the reference frequency, the sinusoidal ILM output signal being generated with a higher slew rate than the reference signal;
generating, by a group of one or more buffer amplifiers of the reference path circuit, the output clock signal based on a sign function of the ILM output signal,
wherein the group of one or more buffer amplifiers include at least a first buffer amplifier and generate the output clock signal by receiving, via the first buffer amplifier, the sinusoidal ILM output signal, generating a first output clock signal such that (i) a level of phase noise associated with the first output clock signal when receiving the sinusoidal ILM output signal at the integer multiple of the reference frequency is less than (ii) the phase noise associated with first output clock signal when receiving the sinusoidal ILM output signal at the reference frequency, and generating the output clock signal based upon the first output clock signal, and
wherein the integer multiple of the reference frequency is within a locking range of the ILM, and the locking range is based on a resonant frequency of the ILM.

21. The method according to claim 20, wherein the ILM is included in the reference path circuit to enable a reduction in a phase noise of the output clock signal.

* * * * *